(12) United States Patent
Lee

(10) Patent No.: US 9,343,622 B2
(45) Date of Patent: May 17, 2016

(54) NITRIDE SEMICONDUCTOR LIGHT EMITTING DEVICE AND FABRICATION METHOD THEREOF

(75) Inventor: Suk Hun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 142 days.

(21) Appl. No.: 13/219,118

(22) Filed: Aug. 26, 2011

(65) Prior Publication Data

US 2011/0318857 A1 Dec. 29, 2011

Related U.S. Application Data

(62) Division of application No. 11/722,665, filed as application No. PCT/KR2005/004118 on Dec. 5, 2005, now Pat. No. 8,030,639.

(30) Foreign Application Priority Data

Dec. 23, 2004 (KR) ......................... 10-2004-0111085

(51) Int. Cl.
  *H01L 33/12* (2010.01)
  *H01L 33/00* (2010.01)

(52) U.S. Cl.
  CPC .............. *H01L 33/12* (2013.01); *H01L 33/007* (2013.01)

(58) Field of Classification Search
  CPC ..................................................... H01S 5/0213
  See application file for complete search history.

(56) References Cited

U.S. PATENT DOCUMENTS

| 5,929,466 | A | 7/1999 | Ohba et al. |
| 2001/0035531 | A1 | 11/2001 | Kano et al. |
| 2002/0171092 | A1 | 11/2002 | Goetz et al. |
| 2002/0179918 | A1 | 12/2002 | Sung et al. |
| 2003/0173560 | A1 | 9/2003 | Kano et al. |
| 2003/0178633 | A1* | 9/2003 | Flynn et al. ................... 257/101 |
| 2005/0230688 | A1* | 10/2005 | Lee ................................ 257/79 |
| 2006/0091404 | A1 | 5/2006 | Shen et al. |
| 2007/0126009 | A1* | 6/2007 | Sakai et al. ...................... 257/79 |

FOREIGN PATENT DOCUMENTS

| JP | 7302929 | 11/1995 |
| JP | 10-173220 A | 6/1998 |
| JP | 11-054794 A | 2/1999 |
| JP | 2002-033513 A | 1/2002 |
| JP | 2002-299685 A | 10/2002 |
| WO | WO-2004/017431 A1 | 2/2001 |
| WO | WO-2004/017432 A1 | 2/2004 |

OTHER PUBLICATIONS

Office Action dated Mar. 13, 2012 in Japanese Application No. 2007-548055, filed Dec. 5, 2005.

\* cited by examiner

*Primary Examiner* — Fernando L Toledo
*Assistant Examiner* — Valerie N Newton
(74) *Attorney, Agent, or Firm* — Saliwanchik, Lloyd & Eisenschenk

(57) ABSTRACT

Provided is a nitride semiconductor light emitting device including: a substrate; a first buffer layer formed above the substrate; an indium-containing second buffer layer formed above the first buffer layer; an indium-containing third buffer layer formed above the second buffer layer; a first nitride semiconductor layer formed above the third buffer layer; an active layer formed above the first nitride semiconductor layer; and a second nitride semiconductor layer formed above the active layer. According to the present invention, the crystal defects are further suppressed, so that the crystallinity of the active layer is enhanced, and the optical power and the operation reliability are enhanced.

20 Claims, 2 Drawing Sheets

NITRIDE SEMICONDUCTOR LIGHT EMITTING DEVICE AND FABRICATION METHOD THEREOF

CROSS REFERENCE TO RELATED APPLICATIONS

This application is a divisional of U.S. application Ser. No. 11/722,665, filed Jun. 22, 2007, which is the U.S. national stage application of International Patent Application No. PCT/KR2005/004118, filed Dec. 5, 2005, which claims priority to Korean Patent Application No. 10-2004-0111085, filed Dec. 23, 2004, all of which are incorporated herein by reference in their entirety.

BACKGROUND

1. Technical Field

The present invention is relative to a nitride semiconductor light emitting device and fabrication method thereof, and to a nitride semiconductor light emitting device and fabrication method thereof in which optical power and reliability are enhanced.

2. Background Art

A schematic stack structure of a general nitride semiconductor light emitting device and a fabrication method thereof will now be described.

FIG. 1 is a sectional view of a general nitride semiconductor light emitting device.

Referring to FIG. 1, a conventional nitride semiconductor light emitting device includes a substrate 101, a buffer layer 103, an n-GaN layer 105, an active layer 107 and a p-GaN layer 109.

Herein, in order to minimize the occurrence of crystal defects due to differences in the lattice constants and the thermal expansion coefficients of the substrate 101, for example, sapphire substrate, and the n-GaN layer 105, a GaN-based nitride or an AlN-based nitride having an amorphous phase at a low temperature is formed as the buffer layer 103.

The n-GaN layer 105 doped with silicon at a doping concentration of $10^{18}/cm^3$ is formed at a high temperature as a first electrode contact layer. Thereafter, the growth temperature is lowered and the active layer 107 is formed. Thereafter, the growth temperature is again elevated and the p-GaN layer 109 doped with magnesium (Mg) is formed.

The nitride semiconductor light emitting device having the aforementioned stack structure is formed in a p-/n-junction structure which uses the n-GaN layer 105 as the first electrode contact layer and uses the p-GaN layer 109 as the second electrode contact layer. A second electrode material formed on the second electrode contact layer is limited depending on a doping type of the second electrode contact layer. In the conventional art, in order to decrease the contact resistance between the second contact material and the p-GaN layer 109 having a high resistance component and enhance the current spreading, a thin transmissive resistance material of a Ni/Au alloy is used as the second electrode material.

In the technique of fabricating the conventional art p-/n-junction light emitting device, in order to suppress the crystal defects occurring due to differences in the lattice constants and the thermal expansion coefficients of the sapphire substrate and the n-GaN semiconductor, a low temperature GaN buffer layer or AlN buffer layer can be used to obtain a GaN semiconductor having the crystal defect density of $\sim 10^8/cm^3$. However, in order to increase the optical power of the light emitting device and enhance the reliability of the light emitting device against ESD (electro-static discharge) or the like, it is required to grow a GaN semiconductor having a much lower crystal defect density.

To solve the above problems, a variety of growth techniques, such as a 'lateral overgrowth' or 'pendeo-growth' using insulator or refractory metal have been employed to decrease the crystal defect density to at least $\sim 10^7/cm^3$.

However, these growth techniques have a drawback such as the complexity in the fabrication technique. Also, these growth techniques can use a GaN substrate to effectively suppress the crystal defects, but are required with continuous research and development for mass production in terms of technique or price.

Occurrence reason of the above crystal defects and problems caused by the crystal defects will now be described in more detail. First, in the case of low temperature amorphous GaN buffer layer or low temperature amorphous AlN buffer layer, when the amorphous layer is recrystallized at a high temperature, it forms a 'poly-like' crystal phase. Therefore, an initial GaN semiconductor has a very rough surface state and a bad flatness, but as the growth continues, a vertical growth is preceded and then a two-dimensional growth is preceded to obtain a good quality of nitride semiconductor. At this time, in the vertical growth corresponding to the initial stage of the growth, crystal defects are generated at a boundary of a fusion with a GaN island. The crystal defects are generated in various types propagated to a surface of the light emitting device, such as 'threading dislocation', 'screw dislocation', 'line dislocation', 'point defect', or 'mixture', which badly influences the device reliability.

Especially, in the case of the sapphire substrate, the 'threading dislocation' is propagated to the surface of the light emitting device. During the propagation, the 'threading dislocation' passes through the active layer emitting light and accordingly it later serves as a current path for leakage current or the like. For example, when a high voltage such as ESD or the like is instantly applied, the active layer is destroyed or the optical power is lowered. The above problems provide fundamental reasons badly influencing the reliability.

Due to the above reasons, to effectively enhance the optical power and reliability of the light emitting device, a crystal growth method that can fundamentally minimize the crystal defects propagating from the sapphire substrate is essentially required.

BRIEF SUMMARY

Technical Problem

To solve the above problem, the present invention provides a nitride semiconductor light emitting device and fabrication method thereof that can decrease crystal defects and enhance the crystallinity of an active layer.

Also, the present invention provides a nitride semiconductor light emitting device and fabrication method thereof that can enhance the optical power and operation reliability.

Technical Solution

In an aspect of the present invention, there is provided a nitride semiconductor light emitting device including: a substrate; a first buffer layer formed above the substrate; an indium-containing second buffer layer formed above the first buffer layer; an indium-containing third buffer layer formed above the second buffer layer; a first nitride semiconductor layer formed above the third buffer layer; an active layer formed above the first nitride semiconductor layer; and a second nitride semiconductor layer formed above the active layer.

In another aspect of the present invention, there is provided a nitride semiconductor light emitting device including: a substrate; a first buffer layer formed above the substrate; a second buffer layer formed above the first buffer layer at a temperature higher than a growth temperature of the first buffer layer; a third buffer layer containing indium and formed above the second buffer layer; a first electrode contact layer formed above the third buffer layer; an active layer formed above the first electrode contact layer; and a second electrode contact layer formed above the active layer.

In another aspect of the present invention, there is provided a nitride semiconductor light emitting device including: a substrate; a first buffer layer formed above the substrate; an indium-containing second buffer layer formed above the first buffer layer; an indium-containing third buffer layer formed above the second buffer layer; an indium-doped nitride semiconductor layer formed above the third buffer layer; a first nitride semiconductor layer formed above the indium-doped nitride semiconductor layer; an active layer formed above the first nitride semiconductor layer; a second nitride semiconductor layer formed above the active layer; and a third nitride semiconductor layer formed above the second nitride semiconductor layer.

In another aspect of the present invention, there is provided a method of fabricating a nitride semiconductor light emitting device, the method including: forming a first buffer layer above a substrate; forming a second buffer layer containing indium above the first buffer layer; forming a third buffer layer containing indium above the second buffer layer; forming an indium-doped GaN layer above the third buffer layer; forming a first nitride semiconductor layer above the indium-doped GaN layer; forming an active layer above the first nitride semiconductor layer; and forming a second nitride semiconductor layer above the active layer.

Advantageous Effects

According to the present invention, the crystal defects of the nitride semiconductor light emitting device are decreased, the crystallinity of the active layer, and the optical power and reliability of the light emitting device can be enhanced.

BRIEF DESCRIPTION OF THE DRAWINGS

FIG. 3 is a graph illustrating a temperature change at each stage in a method of fabricating a nitride semiconductor light emitting device according to the conventional art, and FIG. 4 is a graph illustrating a temperature change at each stage in a method of fabricating a nitride semiconductor light emitting device according to the present invention.

DETAILED DESCRIPTION

Hereinafter, embodiments of the present invention will be described in more detail with reference to the accompanying drawings.

Figure 1:
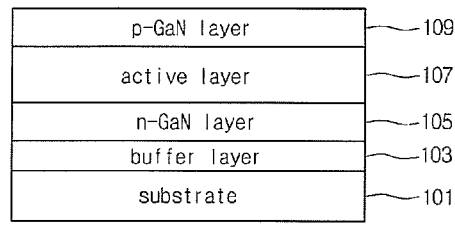
FIG. 1 is a sectional view of a general nitride semiconductor light emitting device.
Figure 2:
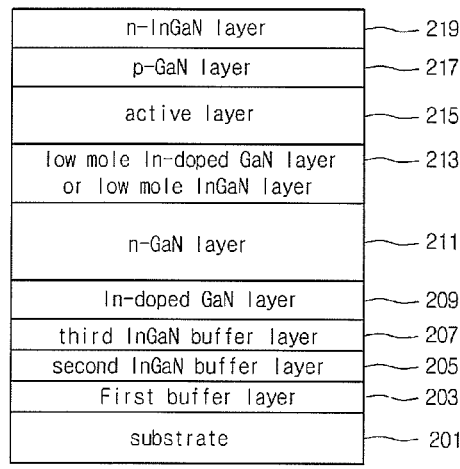
FIG. 2 is a sectional view of a nitride semiconductor light emitting device according to the present invention.

FIG. 2 is a sectional view of a nitride semiconductor light emitting device according to the present invention.

Referring to FIG. 2, the nitride semiconductor light emitting device of the present invention includes a substrate 201, a first buffer layer 203, a second InGaN buffer layer 205, a third InGaN buffer 207, an In-doped GaN layer 209, an n-GaN layer 211, a low-mole In-doped GaN layer or low-mole InGaN layer 213, an active layer 215, a p-GaN layer 217, and an n-InGaN layer 219.

The aforementioned layers will be described in more detail. First, the first buffer layer 203 is grown in a low temperature range of 500-600° C. on the substrate 201, for example, sapphire substrate. The first buffer layer 203 can be formed in one selected from the group consisting of a stack structure of AlInN/GaN, a super lattice structure of InGaN/GaN, a stack structure of AlInN/AlN, a stack structure of $In_xGa_{1-x}N/GaN$, and a stack structure of $Al_xIn_yGa_{1-(x+y)}N/In_xGa_{1-x}N/GaN$. Thereafter, a recrystallization of the first buffer layer 203 is performed at a high temperature.

Next, the second InGaN buffer layer 205 having an indium content less than 10% is grown in a temperature range of, for example, 750-850° C., which is higher than the grown temperature of the first buffer layer 203. Thereafter, while the temperature is linearly changed to a growth temperature for growing the In-doped GaN layer 209, the third InGaN buffer layer 207 having the same indium content as the second InGaN buffer layer 205 is grown. In other words, the third InGaN buffer layer 207 is grown while the temperature rises from the growth temperature of the second InGaN buffer layer 205 to a growth temperature of the In-doped GaN layer 209.

Thereafter, the In-doped GaN layer 209 is grown at a high growth temperature, and then the n-GaN layer 211 co-doped with silicon (Si)-indium (In) serving as the first electrode contact layer is grown. In the growing of the n-GaN layer 211, the n-GaN layer 211 can be co-doped with Si—Al. Also, the n-GaN layer 211 can be formed through a delta doping of Si—In or Si—Al. Herein, the delta doping means a state that the concentration of a doped material is periodically different. The delta doping can be easily performed by a method of controlling a flow rate of a doping material, for example, Si—In atoms or Si—Al atoms which are introduced so as to grow the n-GaN layer.

In addition, to increase the internal quantum efficiency of the active layer 215, the low-mole In-doped GaN layer or low-mole InGaN layer 213 having a low indium content is grown, before the active layer 215 is grown, such that the strain of the active layer 215 can be controlled. In the growing of the low-mole In-doped GaN layer or low-mole InGaN layer 213, the contained indium content is adjusted less than 5%, more specifically, within a range of 1-5%. Also, in the growing of the low-mole In-doped GaN layer or low-mole InGaN layer 213, its thickness is adjusted in a range of 100-300 Å.

Thereafter, as the active layer 215 emitting a light having a desired wavelength band, a single quantum well layer or a multi quantum well layer having one period of well layer/barrier layer, for example, $In_xGa_{1-x}N(15\sim35\%)/In_yGa_{1-y}N$ (less than 5%) is grown. Although not shown in the drawings, an SiNx cluster layer may be further formed between the well layer and the barrier layer in the unit of atomic level to increase the light emitting efficiency of the active layer 215.

Next, the growth temperature is increased to grow the p-GaN layer 217. The p-GaN layer 217 is formed by a delta doping in which the concentration of a doped material, for example, magnesium (Mg), Al or Mg/Al, is periodically different. Thereafter, the n-InGaN layer 219 serving as the second electrode contact layer is grown in a super grading structure in which the indium content is sequentially adjusted.

As aforementioned, the present invention is characterized by the structures and growth methods of the buffer layers 203, 205 and 207, which will be described in detail.

First, in the growing of the buffer layers 203, 205 and 207, in order to suppress the crystal defects from being generated in a multi buffer layer, such as AlInN/GaN/AlInN/GaN, the first buffer layer 203 is recrystallized at a high temperature, and then the second InGaN buffer layer 205, which is thin less than 500 Å, having the crystallinity at a higher growth temperature than that of the first buffer layer 203 is grown. Thereafter, to grow the In-doped GaN layer 209, the third InGaN buffer layer 207 having the crystallinity while linearly changing the growth temperature to a high temperature is linearly grown.

By the structures of the buffer layers thus grown, it can be prevented that the crystal defects, such as 'threading dislocation' generated in the substrate 201, for example, sapphire substrate can be prevented from being propagated to a surface of the light emitting device through the growth of the second InGaN buffer layer 205 and the third InGaN buffer layer 207. In other words, it becomes possible to suppress the generation of a strain by adjusting the lattice constant and the energy bandgap of the second InGaN buffer layer 205 and the third InGaN buffer layer 207.

Also, the crystal defects of the n-GaN layer 211 and the active layer 215 grown later can be effectively suppressed to enhance the performance of the light emitting device.

In the above fabrication method of the nitride semiconductor light emitting device, the crystal growth of the buffer layer will be described in more detail.

The first buffer layer 203 employed in the nitride semiconductor light emitting device of the present invention is recrystallized at a high growth temperature so as to grow the GaN semiconductor. During the recrystallization, a phase transformation occurs from an amorphous crystal phase to a polycrystal phase. The GaN semiconductor grown on the first buffer layer 203 in which the phase transformation occurs performs the crystal growth through a fusion process between islands. At this time, according to the thickness depending on the growth temperature of the first buffer layer 203, the phase transformation format is changed during the high temperature recrystallization process, and the initial growth mode of the GaN semiconductor is determined by differences in the surface strain and flatness.

In the initial growth mode of the GaN semiconductor in which the fusion between islands occurs, as the thickness increases from a vertical growth mode, a horizontal growth mode precedes the vertical growth mode. At this time, in the fusion process between islands, the vertical growth mode precedes the horizontal growth mode, and therefore crystal defects, such as 'threading dislocation' are formed at a boundary of the fusion process to pass through the active layer and be propagated to the surface of the light emitting device.

To effectively suppress and decrease these initial crystal defects, the present invention recrystallizes the first buffer layer 203 at a high temperature, grows the second InGaN buffer layer 205 at the higher growth temperature than that of the first buffer layer 203, and grows the third InGaN buffer layer 207 while linearly changing the growth temperature. As a result, the flatness and the surface roughness of the buffer layer having a rough polycrystal phase are improved, and the stress of the GaN semiconductor that is subject to a tensile strain is suppressed to grow the GaN semiconductor having the good quality of crystal phase, so that a light emitting device having a good performance in terms of the optical power and reliability can be obtained.

Meanwhile, the nitride semiconductor light emitting device of the present invention forms a n-/p-/n-junction structure. The second electrode material of the light emitting device is determined by a doping phase or an energy bandgap difference of the formed GaN nitride semiconductor. The n-InGaN layer 219 corresponding to the second electrode contact layer of the light emitting device of the present invention has a super grading structure in which the energy bandgap is controlled by linearly changing the indium content so as to increase the current spreading effect. Therefore, the second electrode material can employ a transmissive oxide and a transmissive resistance metal. Examples of the second electrode material include ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, Ni/IrOx/Au/ITO and the like.

The light emitting device having the above construction can enhance the optical power more than 30-50% compared with that of the conventional art, and also enhance the reliability.

Figure 3:
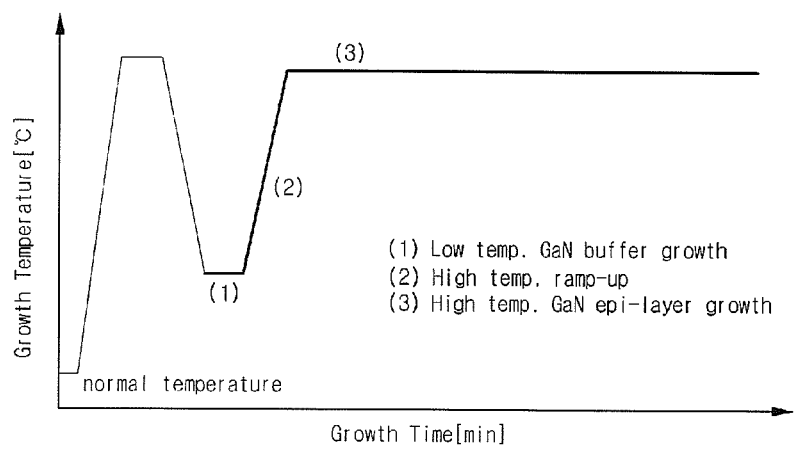
FIGS. 3 and 4 illustrate a process of forming a buffer layer, specifically.
Figure 4:
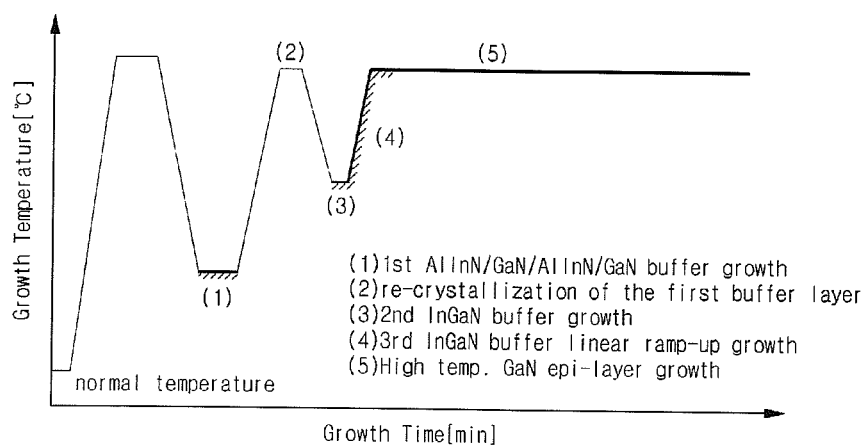

FIGS. 3 and 4 are a view illustrating a process of forming the buffer layer, and the nitride semiconductor light emitting device and fabrication method thereof according to the present invention will now be described in more detail with reference to FIGS. 3 and 4.

FIG. 3 is a graph illustrating a temperature change at each stage in a method of fabricating a nitride semiconductor light emitting device according to the conventional art, and FIG. 4 is a graph illustrating a temperature change at each stage in a method of fabricating a nitride semiconductor light emitting device according to the present invention.

In general, when a bias is applied to a GaN semiconductor light emitting device, a variety of factors, such as an optical power in a forward bias region, life span, a leakage current at a low current in a reverse bias region, electro static discharge, ESD-human body mode due to a high voltage, and the like are used as evaluation data. In such a reliability evaluation, the crystal defect is often pointed out as a fundamental reason influencing a negative result. For example, the crystal defect, such as 'threading dislocation' which is generated by differences in the lattice constant and thermal expansion coefficient between the sapphire substrate and the buffer layer are propagated to a surface of the light emitting device to have the crystal defect more than $\sim 10^8/cm^2$, which badly influences the reliability of the light emitting device. The present invention is characterized by the buffer layer preventing the crystal defects from being propagated.

Referring to FIG. 3, the conventional art method includes three stages, i.e., a first stage (1) of growing an amorphous GaN buffer layer on a sapphire substrate at a low growth temperature, a second stage (2) of linearly increasing the growth temperature to grow a single crystal GaN semiconductor, and a third stage (3) of growing a GaN semiconductor.

In the above conventional art method, during the stage (2) of linearly increasing (ramp-up) the growth temperature to a high growth temperature, the buffer layer is recrystallized, and GaN nucleation is performed on a surface of a phase-transformed polycrystal phase including the amorphous crystal phase. Also, islands are created, a three-dimensional growth mode of these islands is preceded and then a growing is performed through a fusion process in a two-dimensional growth mode having the priority for C-axis. In particular, when the three-dimensional growth mode prevails, the crystal defects, such as 'threading dislocation' is created at a boundary, and above a critical thickness that the two-dimensional growth prevails, the crystallinity of the single crystal GaN semiconductor is determined by the point defect density of a surface.

Also, among the growth factors greatly influencing the crystallinity, when the growth depends on the growth condition of the low temperature GaN buffer layer, a strain difference of the GaN semiconductor having the crystallinity by differences of the grain size and roughness is generated. Under this background, since the lattice constant of the sapphire is larger than that of the GaN semiconductor, the initial GaN nitride semiconductor is directly subject to a compressive strain, so that it in the long run fails to suppress the density of the formed crystal defects.

On the contrary, in the nitride semiconductor light emitting device and fabrication method thereof according to the present invention, FIG. 4 shows a specific fabrication method for controlling the compressive strain to which the conventional GaN semiconductor is subject.

In detail, referring to FIG. 4, the first buffer layer is grown (1), the first buffer layer is recrystallized at a high temperature (2), and in order to control the compression stress caused by the sapphire substrate, the second InGaN buffer layer is grown at a higher temperature than that of the first buffer layer such that the buffer layers have the same tensile strain with sapphire substrate (3). To relax the tensile strain to which the second InGaN buffer layer is subject while the growth temperature is linearly increased (ramp-up), the third InGaN buffer layer is linearly grown (4). Through the aforementioned four steps. a multi buffer layer of the inventive light emitting device is grown.

Thereafter, a step of continuing to grow the GaN semiconductor is performed (5).

According to the present invention, since the second InGaN buffer layer 205 has an indium content less than 5% in the initial growth of the third InGaN buffer layer 207, the indium content is linearly decreased depending on an increase of the growth temperature. In the long run, the buffer layers have the same crystal phase as the GaN nitride semiconductor and therefore the strain can be naturally controlled. In other words, the third InGaN buffer layer is to control the energy bandgap using the growth temperature, and the second and third InGaN layers already include a single crystal phase.

By the aforementioned multi-buffer layer, the crystal defects are further suppressed and the optical power of the active layer is further enhanced.

MODE FOR INVENTION

The above embodiment shows and describes that the nitride semiconductor light emitting device has a n-/p-/n-junction structure by forming the n-GaN layer below the active layer as the first electrode contact layer, forming the p-GaN layer above the active layer, and forming the n-GaN layer above the p-GaN layer as the second electrode layer. However, although not shown in the drawings, the process steps of forming the first, second and third buffer layers which correspond to the feature of the fabrication method of the nitride semiconductor light emitting device according to the present invention can be applied to form an n-GaN layer below the active layer as the first electrode contact layer and forming a p-GaN layer above the active layer as the second electrode contact layer, thereby easily realizing a nitride semiconductor light emitting device having a p-/n-junction structure.

INDUSTRIAL APPLICABILITY

By the nitride semiconductor light emitting device and fabrication method thereof according to the present invention, the crystal defects are further suppressed, so that the crystallinity of the active layer is enhanced, and the optical power and the operation reliability are enhanced.

What is claimed is:

1. A method of fabricating a nitride semiconductor light emitting device, the method comprising:
    forming a first buffer layer above a substrate;
    recrystallizing the first buffer layer at a temperature higher than a growth temperature of the first buffer layer;
    forming a second buffer layer containing indium above the first buffer layer;
    forming a third buffer layer containing indium and configured to directly contact the second buffer layer;
    forming an indium-doped GaN layer above the third buffer layer;
    forming a first nitride semiconductor layer configured to directly contact the indium-doped GaN layer;
    forming an active layer above the first nitride semiconductor layer; and
    forming a second nitride semiconductor layer above the active layer;
    wherein the first nitride semiconductor layer is disposed between the indium-doped GaN layer and the active layer, and
    wherein the second buffer layer has a growth temperature between the growth temperature of the first buffer layer and the temperature of the recrystallizing of the first buffer layer.

2. The method according to claim 1, further comprising forming a third nitride semiconductor layer above the second nitride semiconductor layer.

3. The method according to claim 1, wherein the second buffer layer is grown in a single crystal.

4. The method according to claim 1, wherein the growth temperature of the first buffer layer is in a range of from 500° C. to 600° C., and wherein the growth temperature of the second buffer layer is in a range of from 750° C. to 850° C.

5. The method according to claim 1, wherein the indium content contained in the second buffer layer is less than 10%.

6. The method according to claim 1, wherein the third buffer layer is grown in a single crystal such that the indium content contained therein is decreased.

7. The method according to claim 1, wherein the third buffer layer has a growth temperature which is higher than that of the second buffer layer and is increased to a growth temperature of the indium-doped GaN layer.

8. The method according to claim 1, wherein a growth temperature of the indium-doped GaN layer is the same as the temperature of the recrystallizing of the first buffer layer.

9. The method according to claim 1, wherein the first nitride semiconductor layer is formed by a delta doping in which a concentration of a doped material is periodically varied, and is an n-GaN layer which is delta-doped with silicon/indium or silicon/aluminum.

10. The method according to claim 1, further comprising forming, between the first nitride semiconductor layer and the active layer, a low-mole indium-doped GaN layer or a low-mole InGaN layer having a bottom surface configured to directly contact the first nitride semiconductor layer, a top surface configured to directly contact the active layer, and an indium content of 1-5%.

11. The method according to claim 1, wherein the second nitride semiconductor layer is formed by a delta doping in which a concentration of a doped material is periodically varied, and is a p-GaN layer which is delta-doped with magnesium or aluminum or magnesium/aluminum.

12. The method according to claim 2, wherein the third nitride semiconductor layer is formed in an n-InGaN layer with a super grading structure in which an indium content is varied.

13. The method according to claim 1, wherein the indium-doped GaN layer is configured to directly contact the third buffer layer.

14. The method according to claim 1, wherein the third buffer layer has an indium content which is decreased from a bottom surface of the third buffer layer to a top surface of the third buffer layer to grow the third buffer layer having the same single crystal phase as that of the first nitride semiconductor layer.

15. A method of fabricating a nitride semiconductor light emitting device, the method comprising:
   forming a first buffer layer above a substrate;
   recrystallizing the first buffer layer at a temperature higher than a growth temperature of the first buffer layer;
   forming a second buffer layer containing indium above the first buffer layer, wherein the first buffer layer and the second buffer layer each has substantially the same tensile strain as the substrate;
   forming a third buffer layer containing indium and configured to directly contact the second buffer layer;
   forming an indium-doped GaN layer above the third buffer layer;
   forming a first nitride semiconductor layer configured to directly contact the indium-doped GaN layer;
   forming an active layer above the first nitride semiconductor layer; and
   forming a second nitride semiconductor layer above the active layer,
   wherein the second buffer layer has a growth temperature between the growth temperature of the first buffer layer and the temperature of the recrystallizing of the first buffer layer.

16. The method according to claim 15, further comprising forming a third nitride semiconductor layer above the second nitride semiconductor layer.

17. The method according to claim 15, wherein the third buffer layer has a growth temperature which is higher than that of the second buffer layer and is increased to a growth temperature of the indium-doped GaN layer.

18. The method according to claim 15, wherein the growth temperature of the first buffer layer is in a range of from 500° C. to 600° C., and wherein the growth temperature of the second buffer layer is in a range of from 750° C. to 850° C.

19. The method according to claim 15, wherein a growth temperature of the indium-doped GaN layer is the same as the temperature of the recrystallizing of the first buffer layer.

20. The method according to claim 15, wherein the third buffer layer has substantially the same indium content as the second buffer layer.

* * * * *